(12) United States Patent
Mo et al.

(10) Patent No.: US 10,546,996 B2
(45) Date of Patent: Jan. 28, 2020

(54) MAGNETORESISTIVE RANDOM ACCESS MEMORY (MRAM) STRUCTURE AND METHOD OF FORMING THE SAME

(71) Applicant: Taiwan Semiconductor Manufacturing Co., Ltd., Hsinchu (TW)

(72) Inventors: Chun-Chieh Mo, Kaohsiung (TW); Tsai-Hao Hung, Hsinchu (TW); Shih-Chi Kuo, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/664,513

(22) Filed: Jul. 31, 2017

(65) Prior Publication Data

US 2019/0036013 A1      Jan. 31, 2019

(51) Int. Cl.
*H01L 43/08*    (2006.01)
*H01L 43/02*    (2006.01)
*H01L 43/12*    (2006.01)
*G11C 11/16*    (2006.01)

(52) U.S. Cl.
CPC ............ *H01L 43/08* (2013.01); *G11C 11/161* (2013.01); *H01L 43/02* (2013.01); *H01L 43/12* (2013.01)

(58) Field of Classification Search
CPC ....... G11C 11/161; H01L 43/02; H01L 43/12; H01L 43/08
See application file for complete search history.

(56) References Cited

U.S. PATENT DOCUMENTS

| 2010/0003767 A1* | 1/2010 | Cho | .................. H01L 43/08 438/3 |
| 2014/0286084 A1* | 9/2014 | Watanabe | ............. G11C 11/161 365/158 |
| 2015/0021675 A1* | 1/2015 | Min | .................. H01L 43/08 257/295 |

* cited by examiner

*Primary Examiner* — Bilkis Jahan
*Assistant Examiner* — Victor V Barzykin
(74) *Attorney, Agent, or Firm* — Birch, Stewart, Kolasch & Birch, LLP

(57) ABSTRACT

A magnetoresistive random access memory (MRAM) structure and a method of forming the same are provided. The MRAM structure includes a conductive pillar over a substrate, a first MTJ spacer and a first conductive layer. The first MTJ spacer surrounds the conductive pillar. The first conductive layer surrounds the first MTJ spacer. The first magnetic tunnel junction (MTJ) spacer includes a first electrode, a second electrode and a magnetic tunnel junction (MTJ) layer. The first electrode is in contact with the conductive pillar and the substrate. The second electrode is positioned over the first electrode and in contact with the first conductive layer. The magnetic tunnel junction (MTJ) layer is positioned between the first electrode and the second electrode.

20 Claims, 16 Drawing Sheets

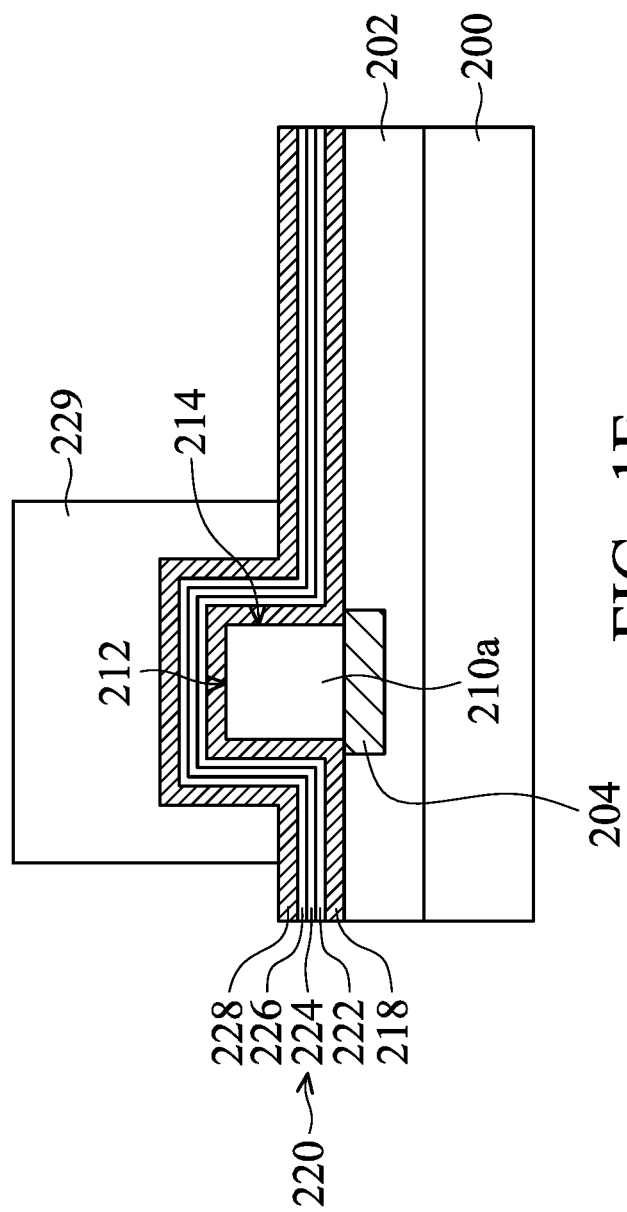

MAGNETORESISTIVE RANDOM ACCESS MEMORY (MRAM) STRUCTURE AND METHOD OF FORMING THE SAME

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Semiconductor memories are used in ICs for electronic applications, including radios, televisions, cell phones, and personal computing devices, as examples. One type of semiconductor memory device is the magnetoresistive random access memory (MRAM) array, which includes conductive lines (word lines and bit lines) positioned in different directions, e.g., perpendicular to each other in different metal layers. A magnetic tunnel junction (MTJ), which functions as a magnetic memory cell, is sandwiched by the conductive lines. Various techniques directed at configurations and materials of MRAMs have been implemented to try and further improve device performance.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-1M are cross-sectional views of various stages of a method of forming an MRAM structure in accordance with some embodiments;

DETAILED DESCRIPTION

Figure 1A:
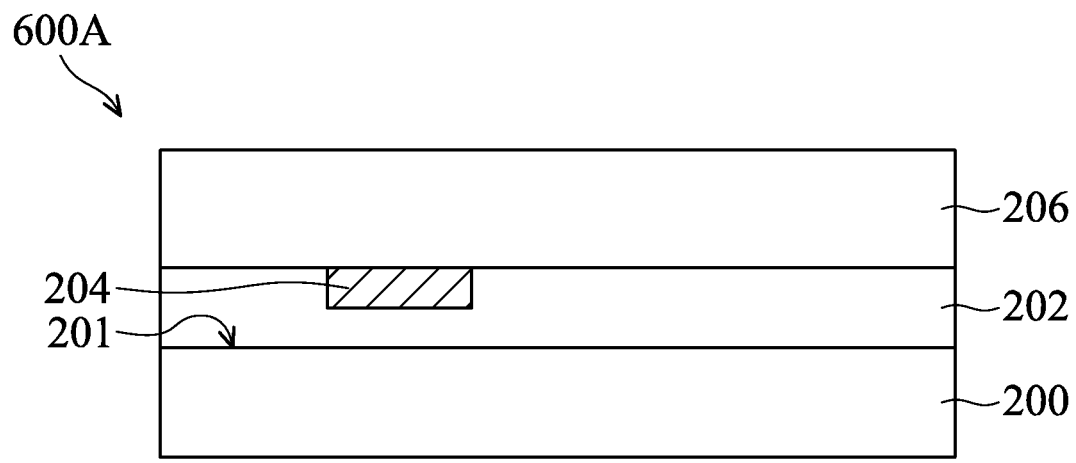

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1M are cross-sectional views of various stages of a method of forming an MRAM structure 600A in accordance with some embodiments. As shown in FIG. 1A, a substrate 200 is received in accordance with some embodiments. The substrate 200 may be a semiconductor wafer such as a silicon wafer. Alternately or additionally, the substrate 200 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP. In some embodiments, the substrate 200 includes an epitaxial layer. For example, the substrate 200 has an epitaxial layer overlying a bulk semiconductor.

Some device elements (not shown) are formed in the substrate 200. Device elements include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes. In some embodiments, device elements are formed in the substrate 200 in a front-end-of-line (FEOL) process.

The substrate 200 may include various doped regions such as p-type wells or n-type wells). Doped regions may be doped with p-type dopants, such as boron or $BF_2$, and/or n-type dopants, such as phosphorus (P) or arsenic (As). The doped regions may be formed directly on the substrate 200, in a P-well structure, in an N-well structure or in a dual-well structure.

The substrate 200 may further include isolation features (not shown), such as shallow trench isolation (STI) features or local oxidation of silicon (LOCOS) features. Isolation features may surround and isolate various device elements.

As shown in FIG. 1A, a dielectric layer 202 (such as an inter-metal dielectric (IMD) layer) is formed over a top surface 201 of the substrate 200. A conductive feature 204 is formed over the substrate 200 and embedded in the dielectric layer 202. The dielectric layer 202 and the conductive feature 204 are formed in a back-end-of-line (BEOL) process.

In some embodiments, the dielectric layer 202 is made of silicon oxide. In some other embodiments, the dielectric layer 202 is made of un-doped silicate glass (USG), fluorinated silicate glass (FSG), carbon-doped silicate glass, silicon nitride or silicon oxynitride.

In some embodiments, the dielectric layer 202 is made of an extreme low-k (ELK) dielectric material with a dielectric constant (k) less than about 2.5. With the geometric size of devices shrinking as technology nodes advance to 30 nm and beyond, an ELK dielectric material is used to minimize device RC (time constant, R: resistance, C: capacitance) delay. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, ELK dielectric material is deposited by a plasma enhanced chemical vapor deposition (PECVD) process or by a spin coating process.

In some embodiments, the conductive feature 204 is a metal line embedded in the first dielectric layer 102. In some other embodiments, the conductive feature 204 is a metal plug (also called a "metal via") formed through the dielectric layer 202. In some other embodiments, the conductive feature 204 is a metal gate or a polysilicon gate surrounded by the dielectric layer 202. In some other embodiments, the conductive feature 204 includes at least one of a metal line, a metal plug, a metal gate, a polysilicon gate, a silicide layer and a doped layer. In some embodiments, the conductive feature 204 includes Al, Cu, Mo, Ti, TiN, Ta, TaN, W, WN, NiSi, CoSi or a combination thereof.

In some embodiments, the conductive feature 204 is formed after the formation of the dielectric layer 202. The method of forming the conductive feature 204 and the dielectric layer 202 may include performing suitable process steps, including deposition, lithography patterning, doping, implanting, and/or etching.

After the conductive feature 204 is formed, an insulating layer 206 is formed over the first dielectric layer 212, as shown in FIG. 1A in accordance with some embodiments. The insulating layer 206 is entirely formed on the first dielectric layer 212 and the conductive feature 204. In some embodiments, the insulating layer 206 is made of silicon oxide ($SiO_2$), silicon oxycarbide polymers (SiOC), silicon oxycarbon nitride (SiOCN), or another applicable material. In some embodiments, the insulating layer 206 is formed by performing a plasma enhanced chemical vapor deposition (PECVD) process, a low pressure chemical vapor deposition (LPCVD) process, an atomic layer deposition (ALD) process, or another applicable process.

Figure 1B:
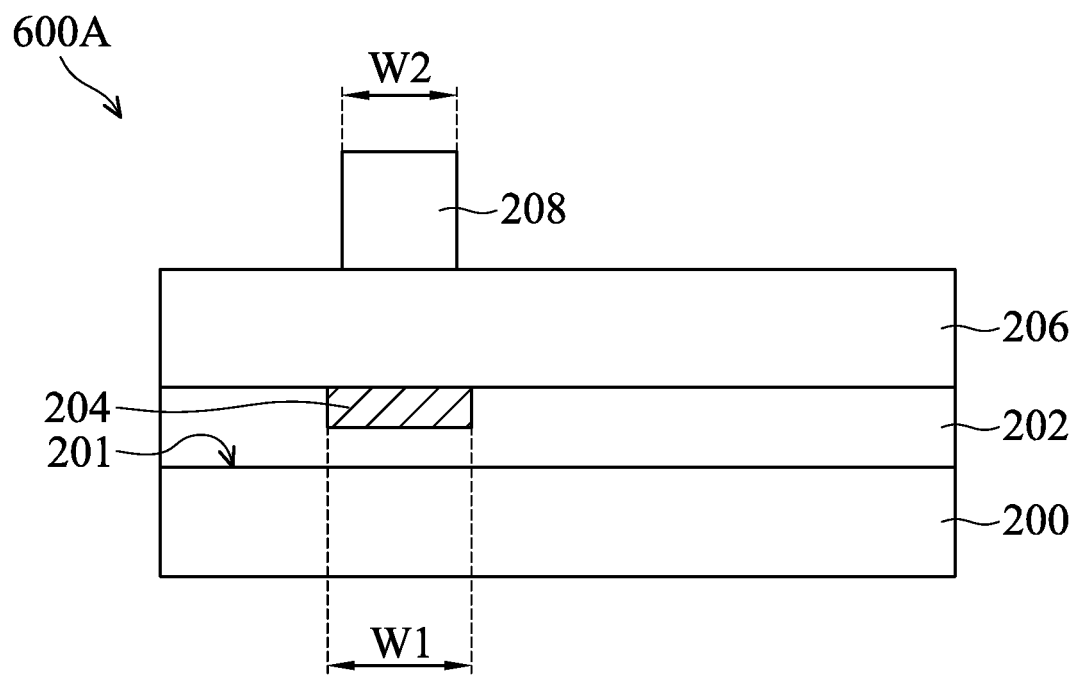

After the insulating layer 206 is formed, a mask layer 208, such as a photoresist (PR), is formed to cover the insulating layer 206, as shown in FIG. 1B in accordance with some embodiments. In some embodiments, the mask layer 208 is formed by a photolithography process. The photolithography process is performed to form a photoresist material (not shown) over the insulating layer 206 and then to pattern the photoresist material. Therefore, the mask layer 208 covering a portion of the insulating layer 206 directly above the conductive feature 204 is formed. In some embodiments, a width W1 of the conductive feature 204 is greater than or equal to a width W2 of the mask layer 208 in the cross-sectional view shown in FIG. 1B.

In some embodiments, the photolithography process includes photoresist coating (e.g. spin-on coating), soft baking, mask aligning, exposure, post-exposure baking, developing the photoresist, rinsing and drying (e.g. hard baking).

Figure 1C:
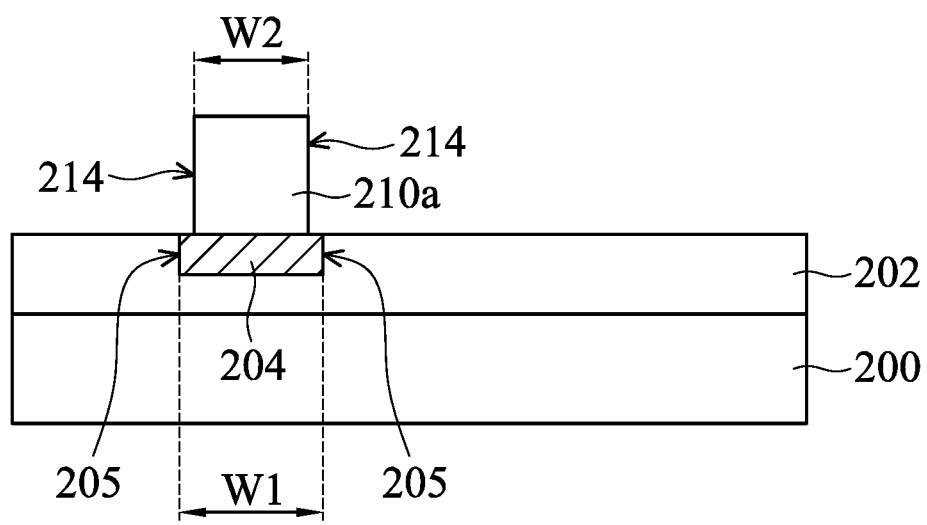
Figure 1D:
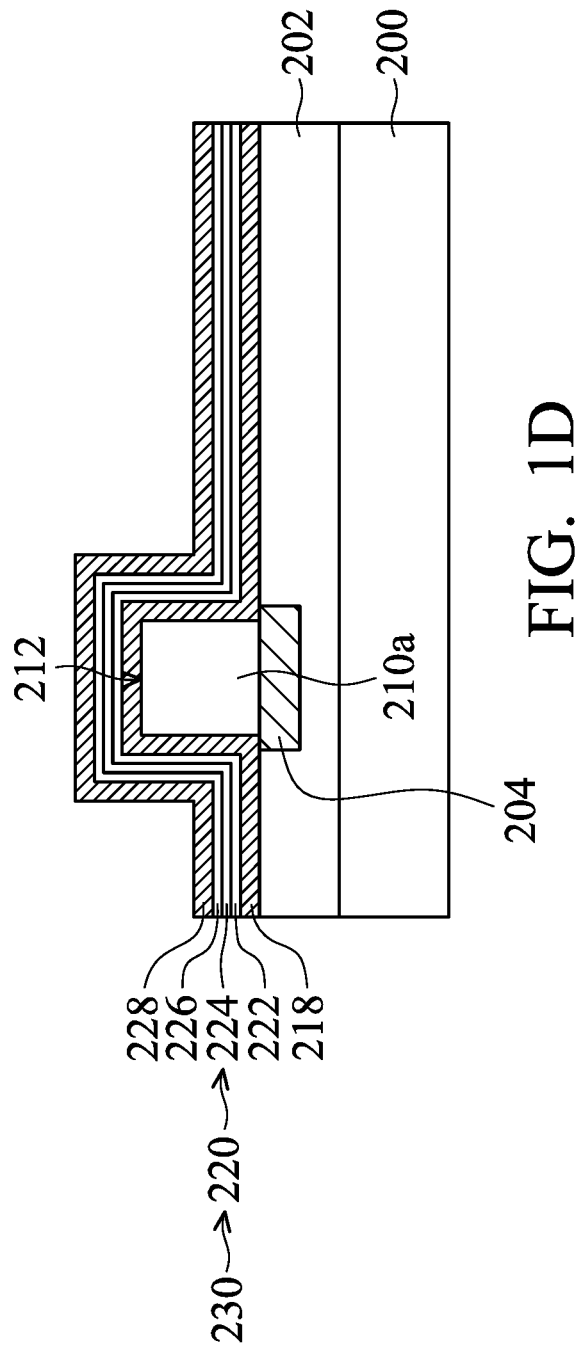

After the mask layer 208 is formed, an etching process (not shown) is performed on the insulating layer 206 by removing the portion of the insulating layer 206 not covered by the mask layer 208. Therefore, an insulating pillar 210a is formed over the substrate 200, as shown in FIG. 1C in accordance with some embodiments. In some embodiments, the insulating pillar 210a is formed directly above the conductive feature 204. The insulating pillar 210a may have cylindrical shape in perspective view (not shown). In addition, a width of the insulating pillar 210a may be the same as the width W2 of the mask layer 208. Therefore, the width W2 of the insulating pillar 210a may be less than or equal to the width W1 of the conductive feature 204. In addition, sidewalls 214 of the insulating pillar 210a may be aligned to or positioned between corresponding sidewalls 205 of the conductive feature 204. In some embodiments, the etching process includes a dry etch process. After the insulating pillar 210a is formed on the conductive feature 204, the mask layer 208 is removed.

After the insulating pillar 210a is formed, a magnetic tunneling junction (MTJ) stack 230 is conformally formed over the insulating pillar 210a. The MTJ stack 230 may be formed covering a top surface 212 and surrounding the sidewalls 214 of the insulating pillar 210a. In some embodiments, the MTJ stack 230 includes a first electrode layer 218, a second electrode layer 228 and a magnetic tunnel junction (MTJ) layer 220 between the first electrode layer 218 and the second electrode layer 228. In addition, the first electrode layer 218 may be in contact with the top surface 212 and the sidewalls 214 of the insulating pillar 210a and the dielectric layer 202. The MTJ layer 220 may be positioned overlying and in contact with the first electrode layer 218. The second electrode layer 228 may be positioned overlying and in contact with the MTJ layer 220. The MTJ layer 220 may be positioned between the first electrode layer 218 and the second electrode layer 228.

In some embodiments, the first electrode layer 218 and the second electrode layer 228 of the MTJ stack 230 includes Pt, Al, Cu, AlCu, Au, Ti, TiN, Ta, TaN, W, WN or a combination thereof, and is formed by a suitable technique such as electroless plating, sputtering, electro plating, physical vapor deposition (PVD), chemical vapor deposition (CVD), atomic layer deposition (ALD) or the like.

In some embodiments, the MTJ layer 220 has a resistivity capable of switching between a high resistance state and a low resistance (or conductive) state, by the application of an electrical voltage. In some embodiments, the MTJ layer 220 includes a high-k dielectric material having a dielectric constant greater than about 8, a binary metal oxide, a transition metal oxide or a combination thereof. In some embodiments, the MTJ layer 220 includes a fixed layer 222, a free layer 226 and a tunnel layer 224 between the fixed layer 222 and the free layer 226. In some embodiments, the fixed layer 222 of the MTJ layer 220 is in physical contact with the first electrode layer 218. The free layer 226 of the MTJ layer 220 is in physical contact with the second electrode layer 228.

The fixed layer 222 and the free layer 226 of the MTJ layer 220 may form two ferromagnetic plates, each of which can hold a magnetic field, separated by the tunnel layer 224. The fixed layer 222 may have a fixed magnetic polarity, and the free layer 226 may have a changeable magnetic polarity to match an external field to store data. Due to a magnetic tunnel effect, the electrical resistance of the MTJ layer 220 changes based on the orientation of the magnetic fields in the two plates, i.e., the fixed layer 222 and the free layer 226. In some embodiments, the MTJ layer 220 has lower resistance if the two plates have the same polarity, and it has higher resistance if the two plates are of opposite polarity.

In some embodiments, the fixed layer 222 includes a synthetic anti-ferromagnetic (SAF) structure. In some embodiments, the fixed layer 222 includes a top pinned layer in physical contact with the tunnel layer 224, a bottom pinned layer and a metal layer between the top pinned layer and the bottom pinned layer. For example, each of the top pinned layer and the bottom pinned layer includes CoFeB, NiFe, CoFe, Fe or a suitable material, and the metal layer includes Ru, Cu, Ta or a suitable material. In some embodiments, the tunnel layer 224 includes MgO, $Al_2O_3$ or a suitable material. In some embodiments, the free layer 226 includes a magnetic material, such as CoFeB, NiFe, CoFe, Fe or a suitable material. In some embodiments, the MTJ layer 220 can be formed by a suitable technique, such as magnetron sputter deposition, molecular beam epitaxy, pulsed laser deposition, electron beam physical vapor deposition, CVD, ALD or a suitable method.

After the MTJ stack 230 is formed, a mask layer 229, such as a photoresist (PR), is formed to cover the MTJ stack 230, as shown in FIG. 1E in accordance with some embodiments. In addition, the mask layer 229 is formed covering the top surface 212 and the sidewalls 214 of the insulating pillar 210a. In some embodiments, the mask layer 229 is formed by a photolithography process. The photolithography process is performed to form a photoresist material (not shown) over the MTJ stack 230 and then to pattern the photoresist material. Therefore, the mask layer 229 covering a portion of the MTJ stack 230 overlying the conductive feature 204 and the insulating pillar 210a is formed.

In some embodiments, the photolithography process includes photoresist coating (e.g. spin-on coating), soft baking, mask aligning, exposure, post-exposure baking, developing the photoresist, rinsing and drying (e.g. hard baking).

Figure 1F:
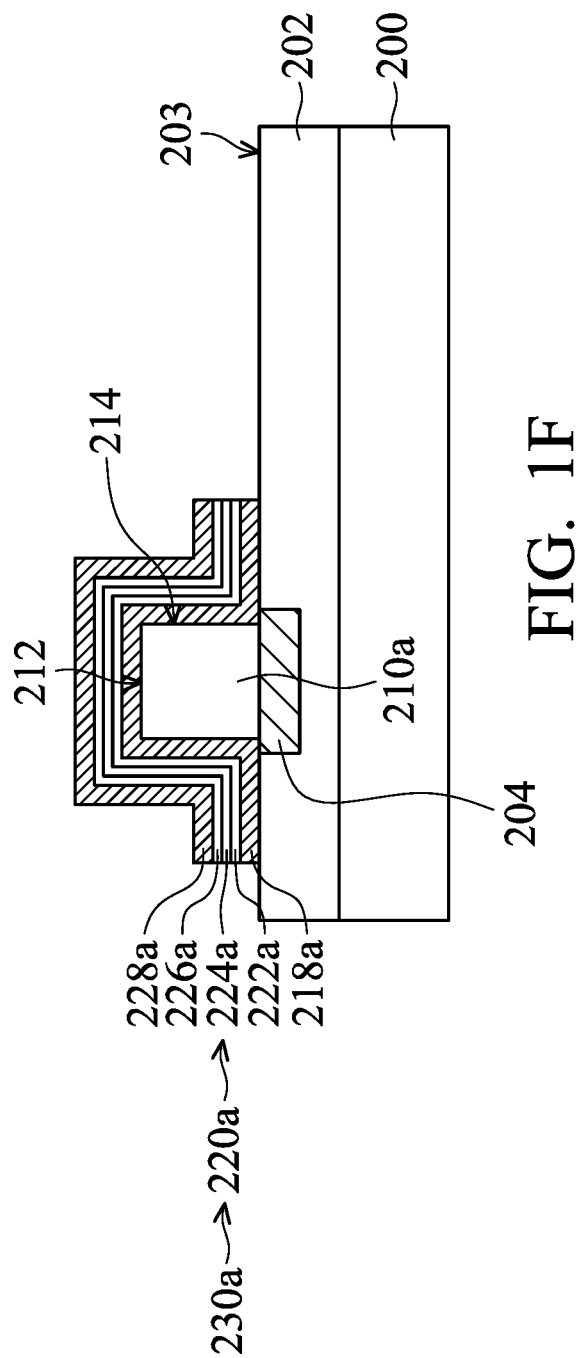

After the mask layer 229 is formed, an etching process (not shown) is performed on the MTJ stack 230 by removing the portion of the MTJ stack 230 not covered by the mask layer 229. Therefore, a MTJ stack 230a is formed over the insulating pillar 210a, as shown in FIG. 1F in accordance with some embodiments. In some embodiments, the MTJ stack 230a is formed covering the top surface 212 and the sidewalls 214 of the insulating pillar 210a. In addition, the MTJ stack 230a is formed extending over a top surface 203 of the dielectric layer 202 outside the insulating pillar 210a. Furthermore, the MTJ stack 230a is formed fully covering the conductive feature 204. In some embodiments, the MTJ stack 230a includes a first electrode layer 218a, a second electrode layer 228a and a magnetic tunnel junction (MTJ) layer 220a between the first electrode layer 218a and the second electrode layer 228a. In some embodiments, the MTJ layer 220a includes a fixed layer 222a, a free layer 226a and a tunnel layer 224a between the fixed layer 222a and the free layer 226a. In some embodiments, the etching process includes a dry etch process. After the MTJ stack 230a is formed on the conductive feature 204, the mask layer 229 is removed.

Figure 1G:
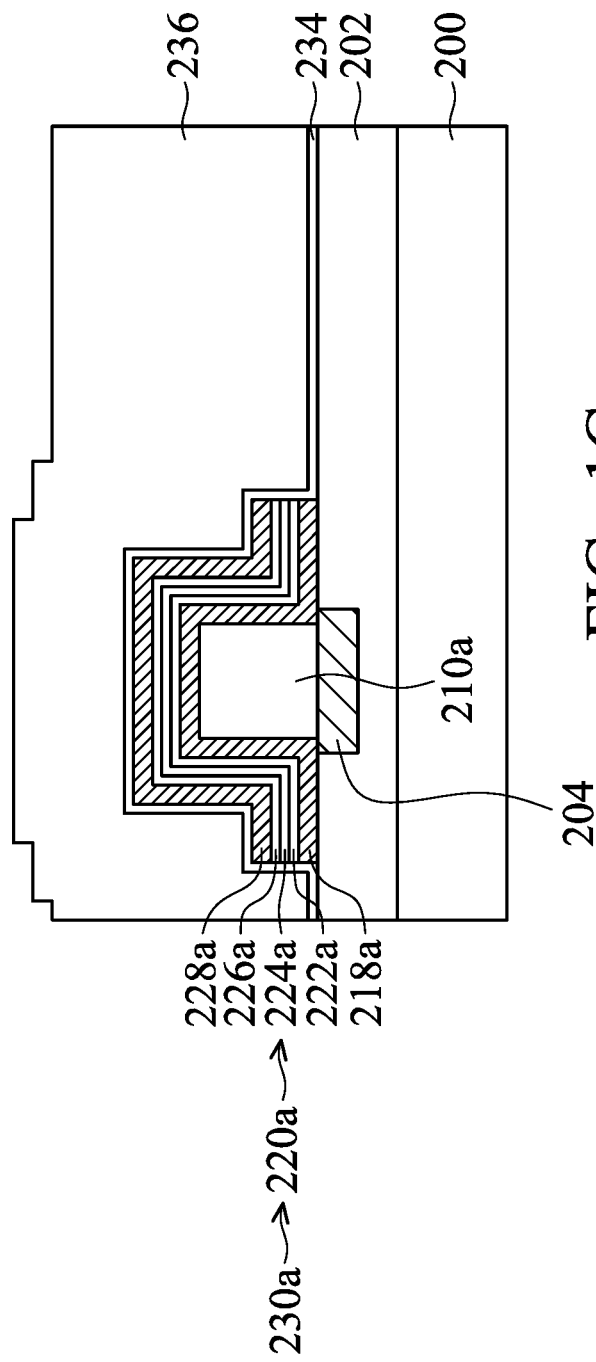

After the MTJ stack 230a is formed, an etching stop layer 234, a dielectric layer 236 are formed over the MTJ stack 230a in sequence, as shown in FIG. 1G in accordance with some embodiments. In some embodiments, the etching stop layer 234 is conformally formed covering the MTJ stack 230a and the dielectric layer 202 outside the insulating pillar 210a. In addition, the dielectric layer 236 entirely formed on the etching stop layer 234. The etching stop layer 234 may be configured to prevent the MTJ stack 230a from being damaged during the subsequent planarization process. In some embodiments, the etching stop layer 234 is made of silicon carbide (SiC), silicon nitride (SixNy), silicon carbonitride (SiCN), silicon oxycarbide (SiOC), silicon oxycarbon nitride (SiOCN), tetraethoxysilane (TEOS) or another applicable material. In some embodiments, the etching stop layer 234 has a bi-layer structure which includes a TEOS layer formed on a SiC layer. A TEOS layer has better moisture prevention than a silicon carbide (SiC) layer. In addition, a SiC layer is used as a glue layer to improve adhesion between the underlying layer and the TEOS layer. In some embodiments, the etching stop layer 234 is formed by performing a suitable deposition process, such as chemical vapor deposition (CVD), atomic layer deposition (ALD), plasma enhanced CVD (PECVD) or the like. The materials, configurations, structures and/or processes of the dielectric layer 236 shown in FIG. 1G may be similar to, or the same as, those of the dielectric layer 202, and the details thereof are not repeated herein.

Figure 1H:
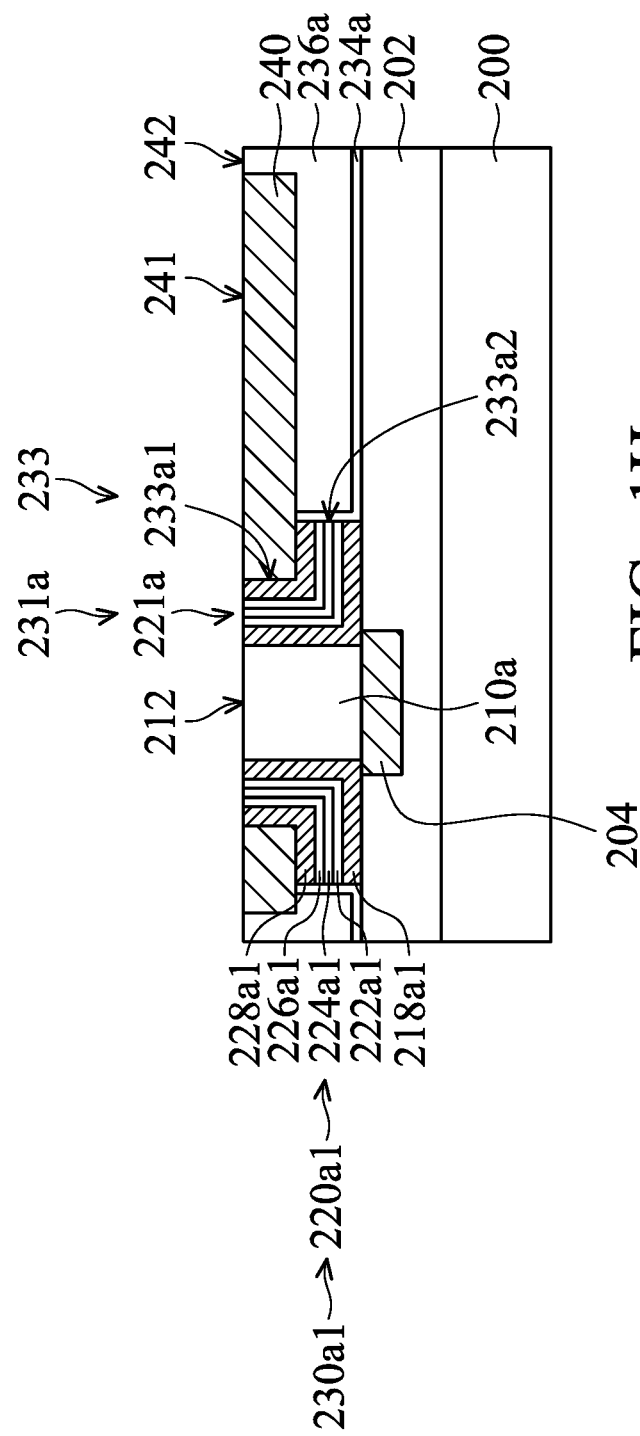

After the etching stop layer 234 and the dielectric layer 236 are formed, a magnetic tunneling junction (MTJ) spacer 230a1, a dielectric layer 236a and an etching stop layer 234a are formed over the sidewalls 214 of the insulating pillar 210a, as shown in FIG. 1H in accordance with some embodiments. In some embodiments, the MTJ spacer 230a1 is L-shaped in the cross-sectional view shown in FIG. 1H. A planarization process (not shown) is performed to remove portions of the MTJ stack 230a and the dielectric layer 236 over the top surface 212 of the insulating pillar 210a until the top surface 212 of the insulating pillar 210a is exposed. Therefore, the MTJ spacer 230a1 including the magnetic tunneling junction (MTJ) layer 220a1 is formed over the sidewalls 214 of the insulating pillar 210a. The MTJ spacer 230a1 may be formed surrounded by the dielectric layer 236a and covered by the etching stop layer 234a.

In some embodiments, the MTJ spacer 230a1 includes a first electrode layer 218a1, a second electrode layer 228a1 and a magnetic tunnel junction (MTJ) layer 220a1 between the first electrode layer 218a1 and the second electrode layer 228a1. In some embodiments, the MTJ layer 220a1 includes a fixed layer 222a1, a free layer 226a1 and a tunnel layer 224a1 between the fixed layer 222a1 and the free layer 226a1. In some embodiments, the planarization process includes a chemical mechanical polishing (CMP) process.

After the MTJ stack 230a1 including the MTJ spacer 230a1 is formed, a conductive layer 240 is formed over an upper outer sidewall 233a1 of the MTJ spacer 230a1. In some embodiments, the conductive layer 240 is formed in the dielectric layer 236a and surrounding the outer sidewall 233 of the MTJ spacer 230a1. The conductive layer 240 may be in contact with the second electrode layer 228a1 of the MTJ spacer 230a1. It should be noted that the conductive layer 240 is formed in an upper portion of the dielectric layer 236a without passing through the dielectric layer 236a. Therefore, the conductive layer 240 may be note in contact with thee in contact with the MTJ layer 220a1 and the first electrode layer 218a1. In addition, a lower outer sidewall 233a2 of the MTJ spacer 230a1 is covered by the etching stop layer 234a. Therefore, the etching stop layer 234a may prevent the first electrode layer 218a1 and the second electrode layer 228a1 of the MTJ spacer 230a1 from shorting with other conductive features.

In some embodiments, the conductive layer 240 is formed by a patterning process (not shown), a deposition process and a subsequent planarization process. The patterning process may be performed to form a hole (not shown) in the dielectric layer 236a. The patterning process may be configured to remove a portion of the dielectric layer 236a. The patterning process may include a photolithography process and a subsequent etching process. In addition, the etching process stops when the etching stop layer 234a on the upper outer sidewall 233a1 of the MTJ spacer 230a1 is exposed. The deposition process may be configured to deposit a conductive material (not shown) filling the hole of the dielectric layer 236a. The planarization process is performed to remove conductive material above the top surface 242 of the dielectric layer 236a. After performing the planarization process, the conductive layer 240 is formed. A top surface 221a of the MTJ layer 220a1, a top surface 231a of the MTJ spacer 230a1, a top surface 241 of the conductive layer 240 and a top surface 242 of the dielectric layer 236a may be coplanar.

In some embodiments, the photolithography process includes photoresist coating (e.g. spin-on coating), soft baking, mask aligning, exposure, post-exposure baking, developing the photoresist, rinsing and drying (e.g. hard baking). The etching process may include a dry etching process, or other applicable processes. The deposition process may include electroless plating, sputtering, electro plating, PVD, CVD, ALD, or other applicable processes. The planarization process may include an etch-back process and/or a chemical mechanical polishing (CMP) process.

Figure 1I:
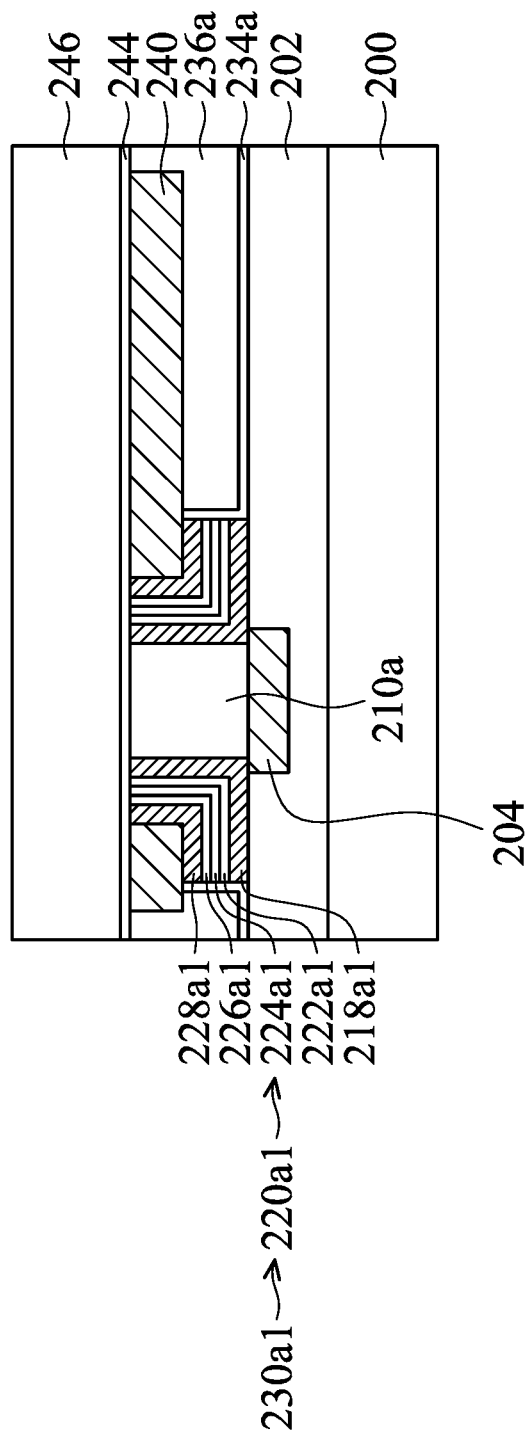

After the conductive layer 240 is formed, an etching stop layer 244 and a dielectric layer 246 are formed over the MTJ spacer 230a1, as shown in FIG. 1I in accordance with some embodiments. The materials, configurations, structures and/or processes of the etching stop layer 244 may be similar to, or the same as, those of etching stop layer 234 (or etching stop layer 234a), and the details thereof are not repeated herein. The materials, configurations, structures and/or processes of the dielectric layer 246 may be similar to, or the same as, those of dielectric layer 236, and the details thereof are not repeated herein.

Figure 1J:
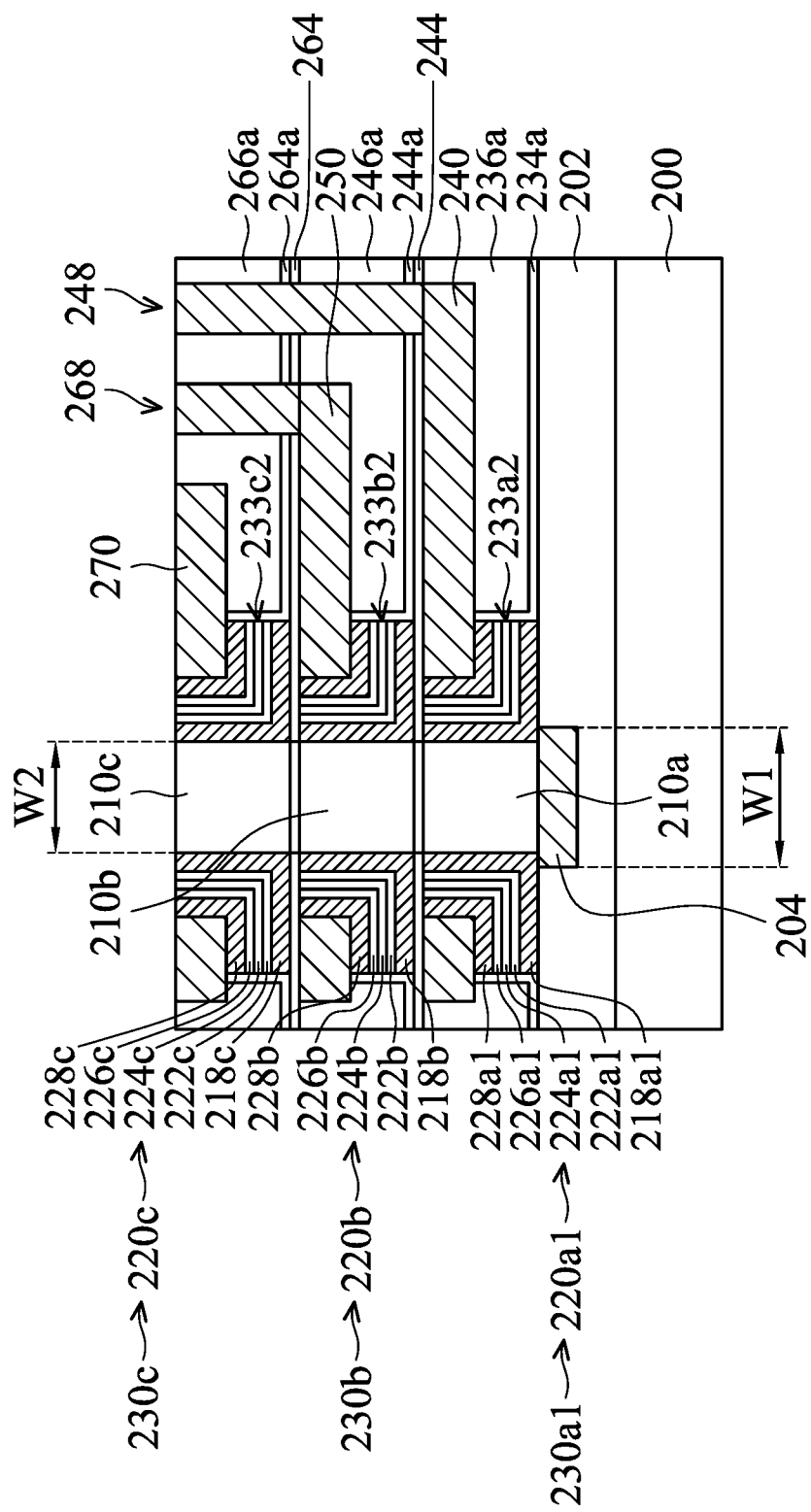
Figure 1K:
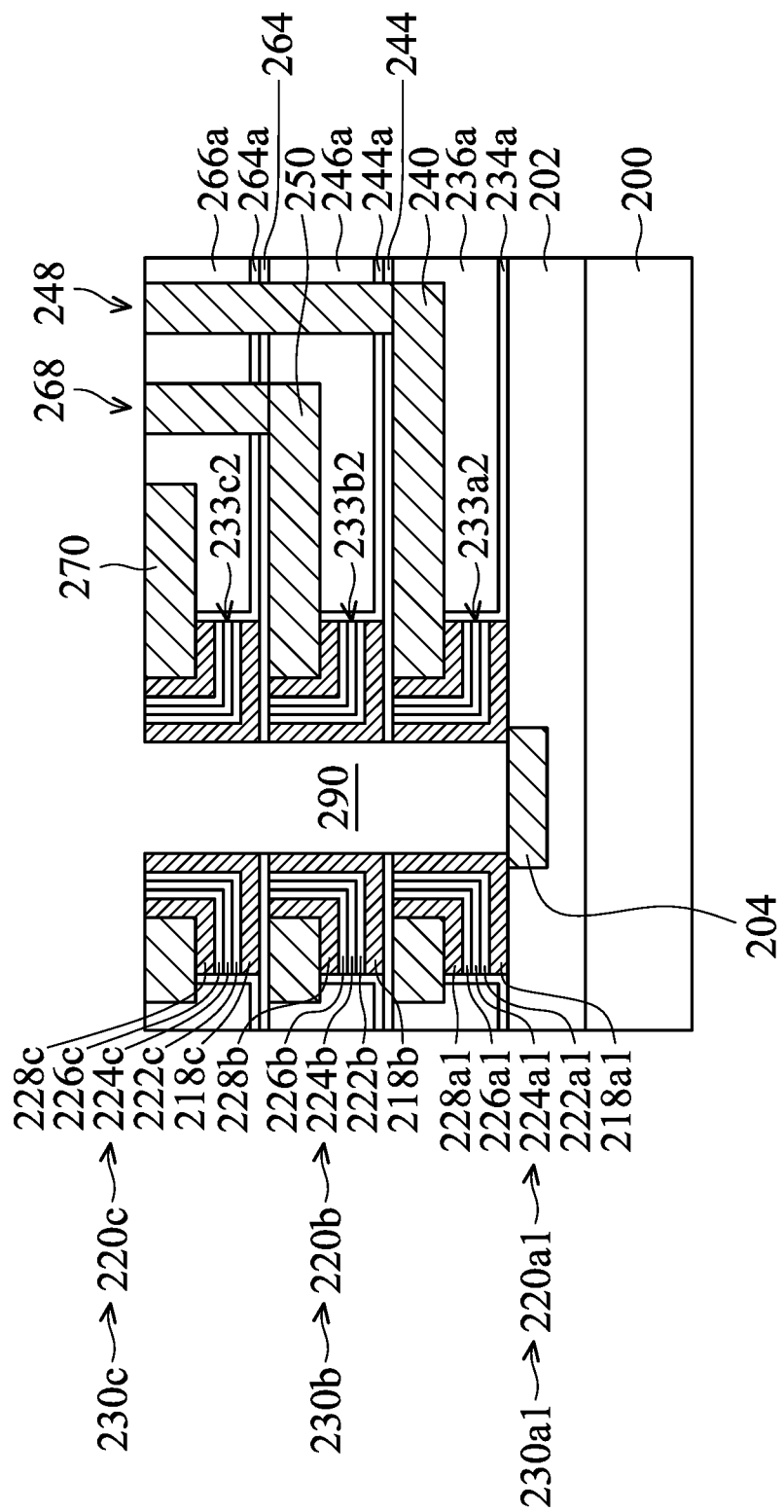

After the etching stop layer 244 and the dielectric layer 246 are formed, processes similar to FIG. 1A to FIG. 1H are repeated several times to form insulating pillars 210b and 210c, MTJ spacers 230b and 230c, dielectric layers 246a and 266a, etching stop layers 244, 244a, 264 and 264a, and conductive layers 250 and 270, as shown in FIG. 1J in accordance with some embodiments. In some embodiments, the insulating pillar 210b is positioned directly above the insulating pillar 210a and the etching stop layer 244, the MTJ spacer 230b surrounds the insulating pillar 210b and positioned over the MTJ spacer 230a1 and the etching stop layer 244, the etching stop layer 244a covers the a lower outer sidewall 233b2 of the MTJ spacer 230b and the conductive layer 240, the conductive layer 250 surrounds the MTJ spacer 230b and the dielectric layer 246a surrounds the MTJ spacer 230b and the conductive layer 250. Similarly, the insulating pillar 210c is positioned directly above the insulating pillar 210b and the etching stop layer 264, the MTJ spacer 230c surrounds the insulating pillar 210c and positioned over the MTJ spacer 230b and the etching stop layer 264, the etching stop layer 264a covers the a lower outer sidewall 233c2 of the MTJ spacer 230c and the conductive layer 250, the conductive layer 270 surrounds the MTJ spacer 230c and the dielectric layer 266a surrounds the MTJ spacer 230b and the conductive layer 250. In some embodiments, widths of the insulating pillars 210b and 210c may be the same as the width W2 of the insulating pillar 210a. In addition, the width W1 of the conductive feature 204 is greater than or equal to the width W2 of the insulating pillars 210b and 210c in the cross-sectional view shown in FIG. 1J. In some embodiments, the repeated times of the processes similar to FIG. 1A to FIG. 1H depends on the number of bits arranged with an MRAM cell.

In some embodiments, the MTJ spacer 230b is positioned directly above the MTJ spacer 230a1 and separated from the MTJ spacer 230a1 by the etching stop layer 244. Similarly, the MTJ spacer 230c is positioned directly above the MTJ spacer 230b and separated from the MTJ spacer 230b by the etching stop layer 264. In some embodiments, the MTJ spacer 230b and the MTJ spacer 230c are L-shaped, which is similar to the shape of the MTJ spacer 230a1, in the cross-sectional view shown in FIG. 1J.

In some embodiments, the MTJ spacer 230b includes a first electrode layer 218b, a second electrode layer 228b and a magnetic tunnel junction (MTJ) layer 220b between the first electrode layer 218b and the second electrode layer 228b. In some embodiments, the MTJ layer 220b includes a fixed layer 222b, a free layer 226b and a tunnel layer 224b between the fixed layer 222b and the free layer 226b. In some embodiments, the MTJ spacer 230c includes a first electrode layer 218c, a second electrode layer 228c and a magnetic tunnel junction (MTJ) layer 220c between the first electrode layer 218c and the second electrode layer 228c. In some embodiments, the MTJ layer 220c includes a fixed layer 222c, a free layer 226c and a tunnel layer 224c between the fixed layer 222c and the free layer 226c.

The materials, configurations, structures and/or processes of the insulating pillars 210b and 210c, MTJ spacers 230b and 230c, dielectric layer 246a and 266a, etching stop layers 244, 244a, 264 and 264a, and conductive layers 250 and 270 may be similar to, or the same as, those of the insulating pillar 210a, the MTJ spacer 230a1, the dielectric layer 236a, the etching stop layer 234a and the conductive layer 240, and the details thereof are not repeated herein.

In some embodiments, the conductive layers 240, 250 and 270 may include multiple metal layers (namely M1, M2, M3 . . . , and Mtop) which are interconnected through vias, such as vias 248 and 268. The via 248 may be formed through the dielectric layers 246a and 266a and positioned outside of the conductive layer 270. The via 248 may be electrically connected to the conductive layer 250 and the MTJ spacer 230a1 in the dielectric layers 236a. In addition, a via 268 may be formed through the dielectric layer 266a. The via 268 may be positioned between the conductive layer 270 and the via 248. The via 268 may be electrically connected to the conductive layer 250 and the MTJ spacer 230b in the dielectric layers 246a. The vias 248 and 268 may be made of a conductive material, such as copper (Cu), aluminum (Al), tungsten (W), or another applicable material. In some embodiments, the vias 248 and 268 are formed by single and/or dual damascene processes.

After the insulating pillars 210b and 210c, the MTJ spacers 230b and 230c, the dielectric layers 246a and 266a, the etching stop layers 244, 244a, 264 and 264a, and the conductive layers 250 and 270 are formed, the laminating insulating pillars 210a, 210b and 210c and portions of the etching stop layers 244 and 264 are simultaneously removed to form an opening 290 by an etching process. The opening 290 is surrounded by the MTJ spacers 230a1, 230b and 230c. In addition, a portion of the first electrode layer 218a1 of the MTJ spacer 230a1, a portion of the first electrode layer 218b of the MTJ spacer 230b and a portion of the first electrode layer 218c of the MTJ spacer 230c and the conductive feature 204 are exposed from the opening 290. In some embodiments, the etching process includes a wet etching process, or other applicable processes.

Figure 1L:
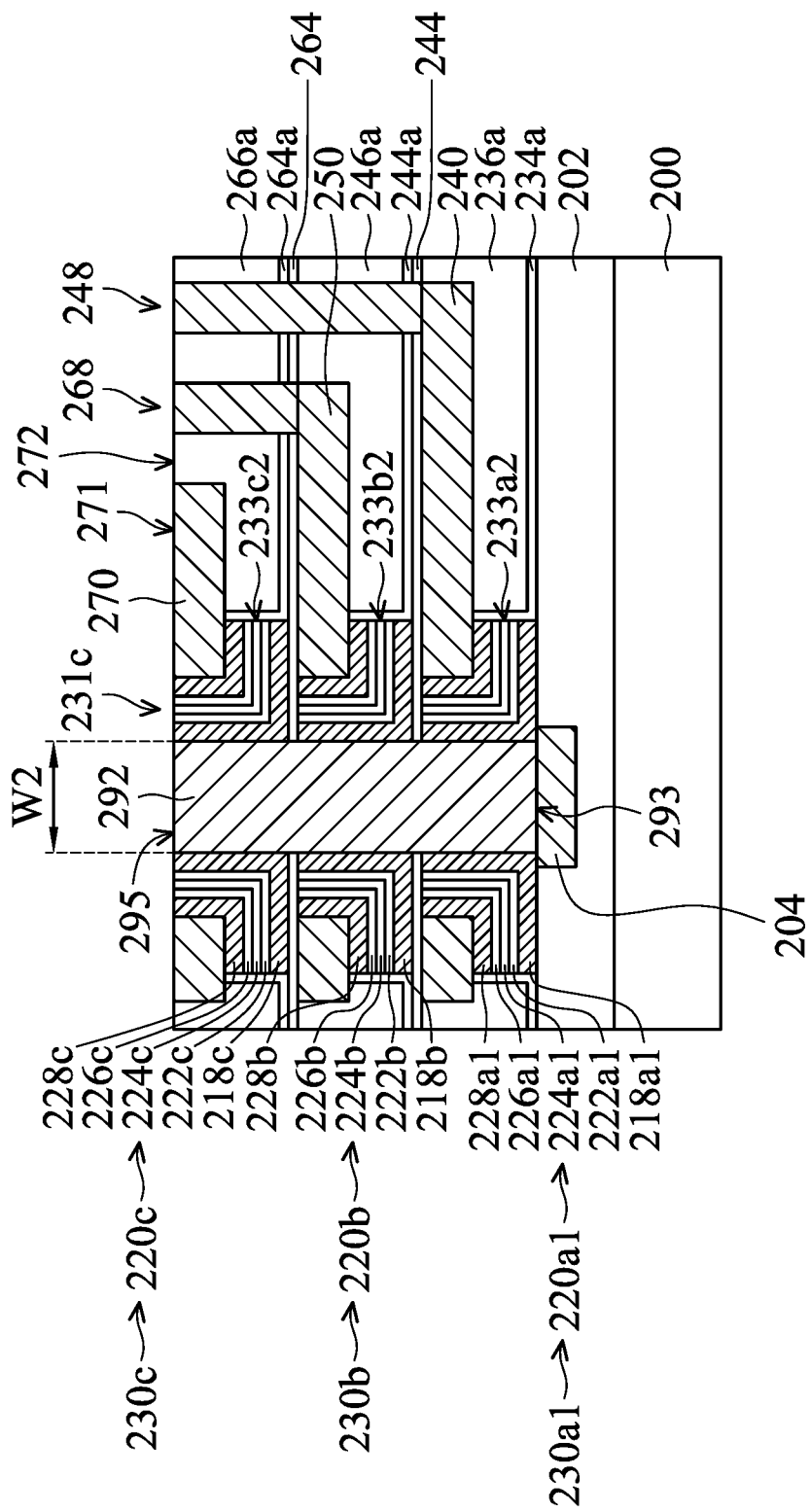

After the opening 290 is formed, a conductive pillar 292 is formed in the opening 290, as shown in FIG. 1L in accordance with some embodiments. The conductive pillar 292 may be formed filling the opening 290 by a deposition process and a subsequent planarization process. The conductive pillar 292 is formed in contact with the portion of the first electrode layer 218a1 of the MTJ spacer 230a1, the portion of the first electrode layer 218b of the MTJ spacer 230b and the portion of the first electrode layer 218c of the MTJ spacer 230c and the conductive feature 204, which are exposed from the opening 290. A bottom surface 293 of the conductive pillar 292 is in contact with the conductive feature 204, and a top surface 295 of the conductive pillar 292 is aligned to a top surface 231c of the of the MTJ spacer 230c, a top surface 271 of the conductive layer 270 and a top surface 272 of the dielectric layer 266a. In some embodiments, a width of the conductive pillar 292 may be the same as the width W2 of the insulating pillars 210a, 210b and 210c (FIG. 1J). In addition, the width W1 of the conductive feature 204 is greater than or equal to the width W2 of the conductive pillar 292 in the cross-sectional view shown in FIG. 1L.

In some embodiments, the conductive pillar 292 includes Al, Cu, Mo, Ti, TiN, Ta, TaN, W, WN or a combination thereof. For example, the conductive pillar 292 is formed of copper or copper alloy. The conductive pillar 292 may be formed by suitable processes such as electroless plating, sputtering, electro plating, PVD, CVD, ALD or the like. In some embodiments, the conductive pillar 292 has a material the same as or different from that of the conductive feature 204.

After the conductive pillar 292 is formed, a conductive feature 296 is formed over the conductive pillar 292. The conductive feature 296 is formed directly above and in contact with the top surface 295 of the conductive pillar 292. In some embodiments, the conductive feature 296 is electrically connected to the first electrode layer 218a1 of the MTJ spacer 230a1, the first electrode layer 218b of the MTJ spacer 230b and the first electrode layer 218c of the MTJ spacer 230c and the conductive feature 204. In addition, the conductive feature 296 may be formed separated from the conductive layers 240, 250 and 270. The conductive feature 296 may be formed separated from the second electrode layer 228a1 of the MTJ spacer 230a1, the second electrode layer 228b of the MTJ spacer 230b and the second electrode layer 228c of the MTJ spacer 230c. In some embodiments, a width W3 of the conductive feature 296 may be greater than or equal to the width W2 of the conductive pillar 292. In addition, the width W1 of the conductive feature 204 may be greater than or equal to the width W3 of the conductive feature 296 in the cross-sectional view shown in FIG. 1M.

In some embodiments, the conductive feature 296 is formed by a deposition process and a subsequent patterning process. In some embodiments, the deposition process includes an electroless plating process, a sputtering process, an electro plating process, a chemical vapor deposition (CVD) process, a physical vapor deposition (PVD) process, an atomic layer deposition (ALD) process, or other applicable processes. In some embodiments, the patterning process includes a photolithography process and a following etching process. In some embodiments, the etching process is a dry etching process. In some embodiments, the conductive feature 296 has a material the same as or different from that of the conductive feature 204.

Figure 1M:
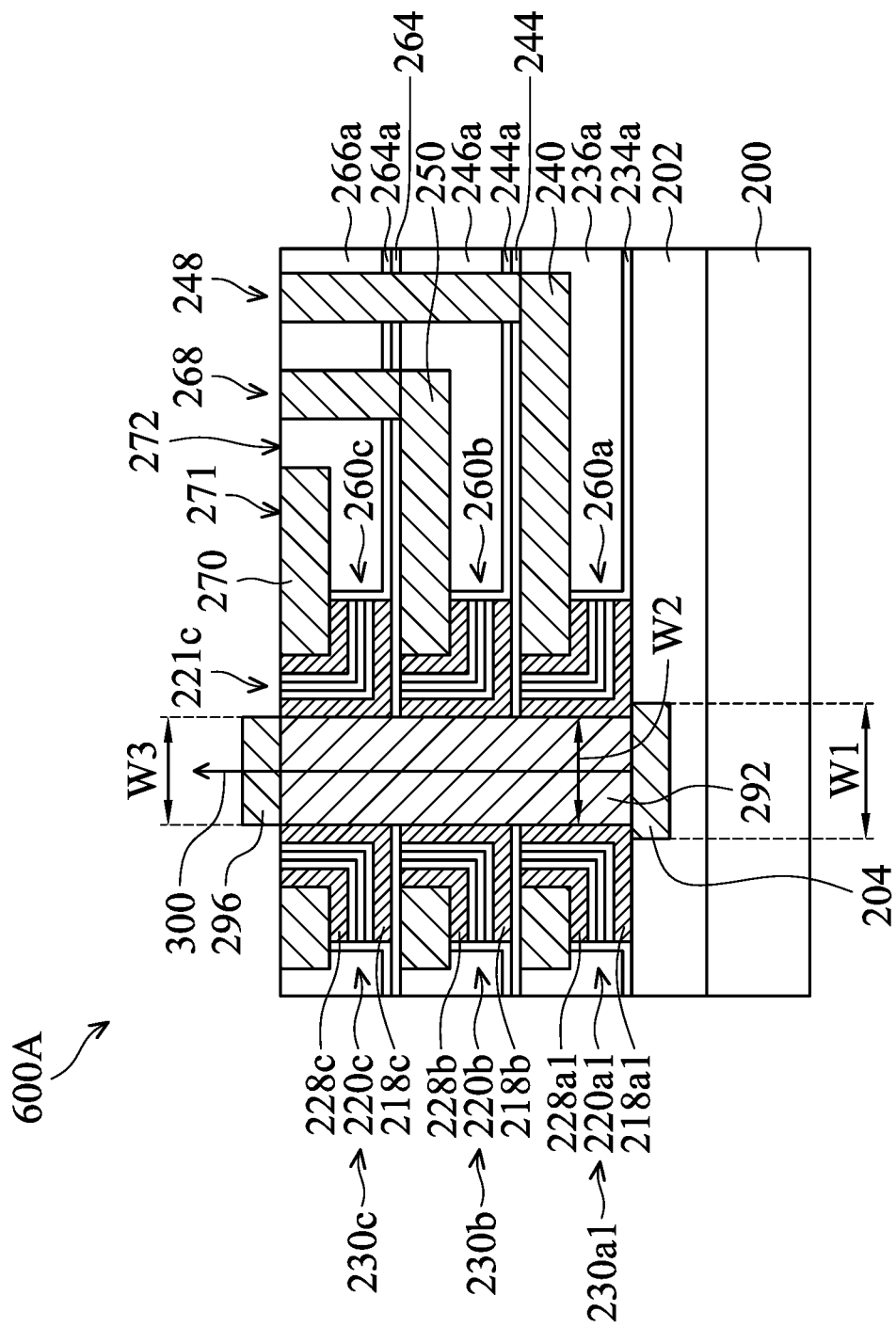

After performing the aforementioned processes, an MRAM structure 600A is formed over the substrate 200, as shown in FIG. 1M in accordance with some embodiments. In some embodiments, the MRAM structure 600A serves as a MRAM cell structure.

Figure 1N:
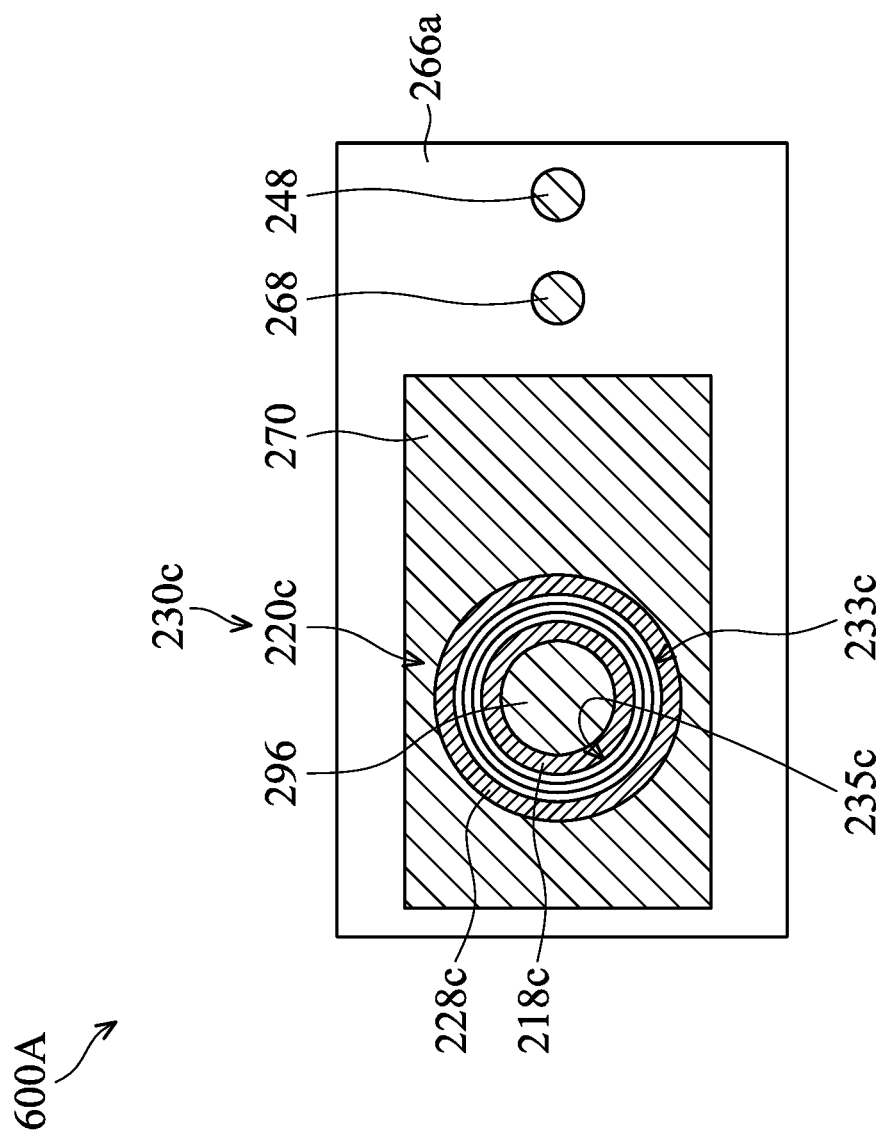
FIG. 1N is a plane view of an MRAM structure as shown in FIG. 1M, in accordance with some embodiments.

FIG. 1N is a plane view of the MRAM structure 600A as shown in FIG. 1M in accordance with some embodiments. Please refer FIGS. 1M and 1N, the conductive pillar 292 may have a cylinder shape. A longitudinal direction (e.g. a direction 300) of the conductive pillar 292 is perpendicular to the top surface 201 of the substrate 200. The MTJ spacer 230c may surrounds the conductive pillar 292. More specifically, the first electrode layer 218c may surround the conductive pillar 292 covered by the conductive feature 296. The MTJ layer 220c may surrounds the first electrode layer 218c and the second electrode layer 228c may surrounds MTJ layer 220c. Therefore, the MTJ spacer 230c including the first electrode layer 218c, the MTJ layer 220c and the second electrode layer 228c may have tube shape (e.g. cylinder tube shape). The MTJ spacer 230c may serve as a MTJ tube structure. For example, the MTJ spacer 230c includes a first electrode tube (e.g. the first electrode layer 218c), a MTJ tube (e.g. the MTJ layer 220c) and a second electrode tube (e.g. the second electrode layer 228c). The MTJ tube (e.g. the MTJ layer 220c) may surround the first electrode tube (e.g. the first electrode layer 218c). The second electrode tube (e.g. the second electrode layer 228c) may surround the MTJ tube (e.g. the MTJ layer 220c). In addition, the MTJ tube (e.g. the MTJ layer 220c) may have an inner sidewall 235c in contact with the first electrode tube (e.g. the first electrode layer 218c) and an outer sidewall 233c in contact with the second electrode tube (e.g. the second electrode layer 228c). In addition, a longitudinal direction (e.g. the direction 300) of the MTJ tube is perpendicular to the top surface 205 of the substrate 200. In some embodiments, a top surface 221c of the MTJ tube (e.g. the MTJ layer 220c), the top surface 295 of the conductive pillar 292, the top surface 271 of the first conductive layer and the top surface 272 of the dielectric layer 266a are coplanar.

In some embodiments, the shapes of the MTJ spacer 230b and the MTJ spacer 230a1 are similar to the shape of the MTJ spacer 230c. For example, the MTJ layer 220a1, the MTJ layer 220b and the MTJ layer 220c may have similar shapes. The first electrode layer 218a1, the first electrode layer 218b and the first electrode layer 218c may have similar shapes. The second electrode layer 228a1, the second electrode layer 228b and the second electrode layer 228c may have similar shapes. Therefore, the MTJ spacer 230a1 and MTJ spacer 230b may serve as MTJ tube structures. The MTJ layer 220b and the MTJ layer 220c may serve as MTJ tube. The first electrode layer 218a1 and the first electrode layer 218b may serve as first electrode tubes. The second electrode layer 228a1 and the second electrode layer 228b may serve as second electrode tubes.

In some embodiments, the MTJ tube (e.g. the MTJ spacers 230a1, 230b and 230c) includes a portion extending outward from the conductive pillar 292. For example, the MTJ tube (e.g. the MTJ spacer 230a1) includes a portion 260a that extends outward from the conductive pillar 292. A portion 260b of the MTJ tube (e.g. the MTJ spacer 230b) and a portion 260c of the MTJ tube (e.g. the MTJ layer 220c) are formed extending outward from the conductive pillar 292.

In some embodiments, the conductive layer 270 fully surrounds an outer boundary of the second electrode layer 228c of the MTJ spacer 230c. In addition, the conductive layer 270 (which is electrically connected to the second electrode layer 228c of the MTJ spacer 230c), via 248 (which is electrically connected to the second electrode layer 228a1 of the MTJ spacer 230a1), and via 268 (which is electrically connected to the second electrode layer 228b of the MTJ spacer 230b) are separated from each other by the dielectric layer 266a.

The MRAM structure 600A uses vertically laminated tube-shaped MTJ spacers to form a three-dimensional (3D) MRAM structure (or a three-dimensional (3D) MRAM cell structure). Each of the tube-shaped MTJ spacers may be used to store a data bit. The tube-shaped MTJ spacers are respectively formed in dielectric layers in different levels. The bottom electrodes (e.g. the first electrodes) of the MTJ spacers are formed surrounding and electrically connected to a single conductive pillar, which is arranged on the substrate 200 and is formed passing through the dielectric layers in different levels. In addition, the top electrodes of the MTJ spacers are electrically connected to conductive layers arranged in the dielectric layers in different levels. The number of stored data bits in the MRAM structure can be increased by laminating the tube-shaped MTJ spacers. Therefore, the MRAM structure has high integration density while the width of the MTJ spacers of the MRAM structure is kept. Furthermore, the bottom electrodes of the MTJ spacers are electrically connected to the same conductive feature (e.g. conductive pillar 292) and the top electrodes of the MTJ spacers are electrically connected to the conductive layers in different dielectric layers (e.g. the inter-layer dielectric (ILD) layers). Therefore, a failure of the MRAM structure can be easily identified. Moreover, the process of forming the MRAM structure can be easily integrated with the existing logic or CMOS process, so the steps of the process are thus simplified and the cost of the process is therefore reduced.

Figure 2:
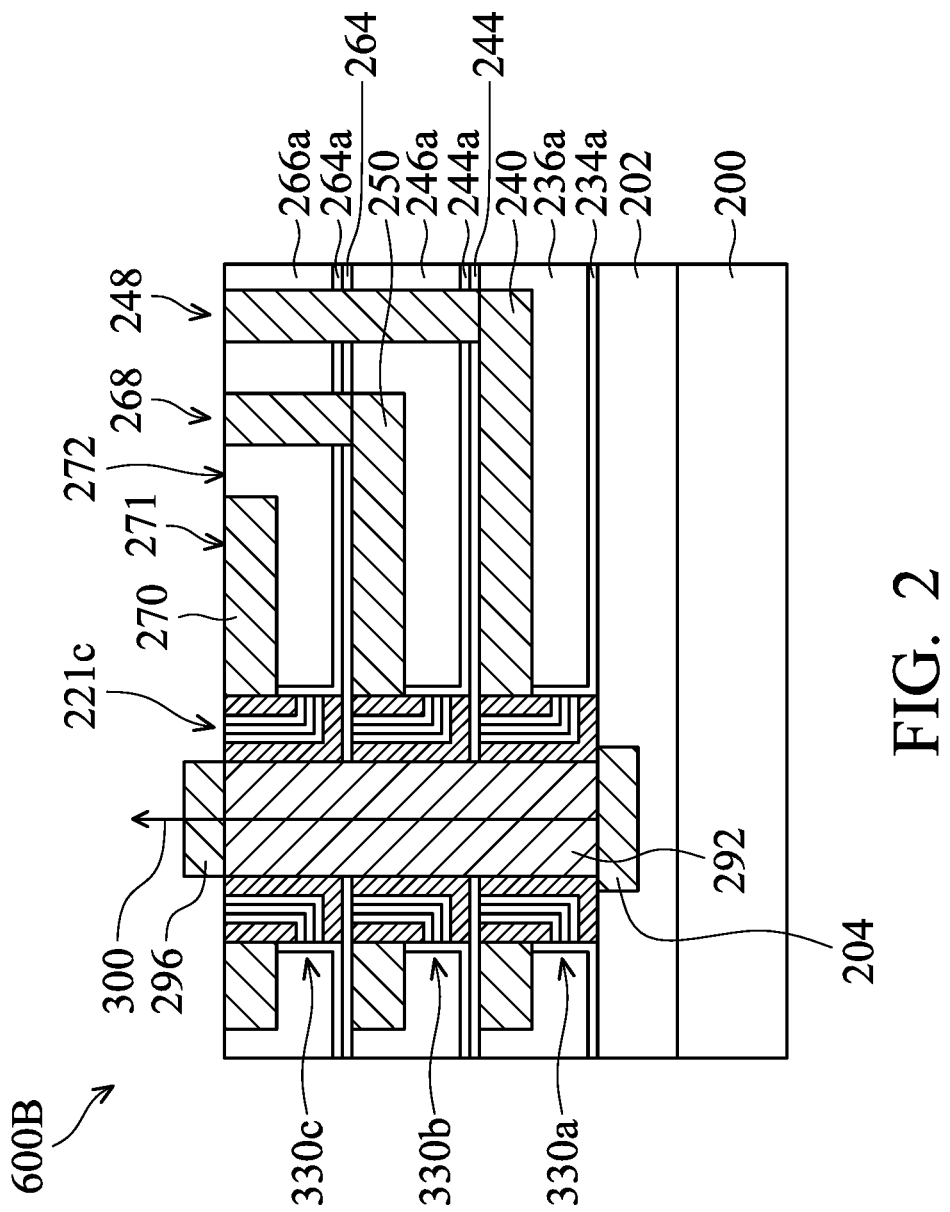
FIG. 2 is a cross-sectional view of an MRAM structure in accordance with some embodiments.

FIG. 2 is a cross-sectional view of an MRAM structure 600B in accordance with some embodiments. The materials, configurations, structures and/or processes utilized in elements of the MRAM structure 600B that are similar to those employed in the MRAM structure 600A shown in FIGS. 1A to 1M are not repeated herein. In some embodiments, the materials, configurations and/or processes utilized in the MTJ spacers 330a, 330b, 330b are similar to the MTJ spacers 230a1, 230b, 230b of the MRAM structure 600A except that the MTJ spacers 330a, 330b, 330b of the of the MRAM structure 600B are I-shaped in the cross-sectional view shown in FIG. 2. In other words, the MTJ spacers 330a, 330b, 330b do not include a portion extending outward from the conductive pillar 292.

Figure 3A:
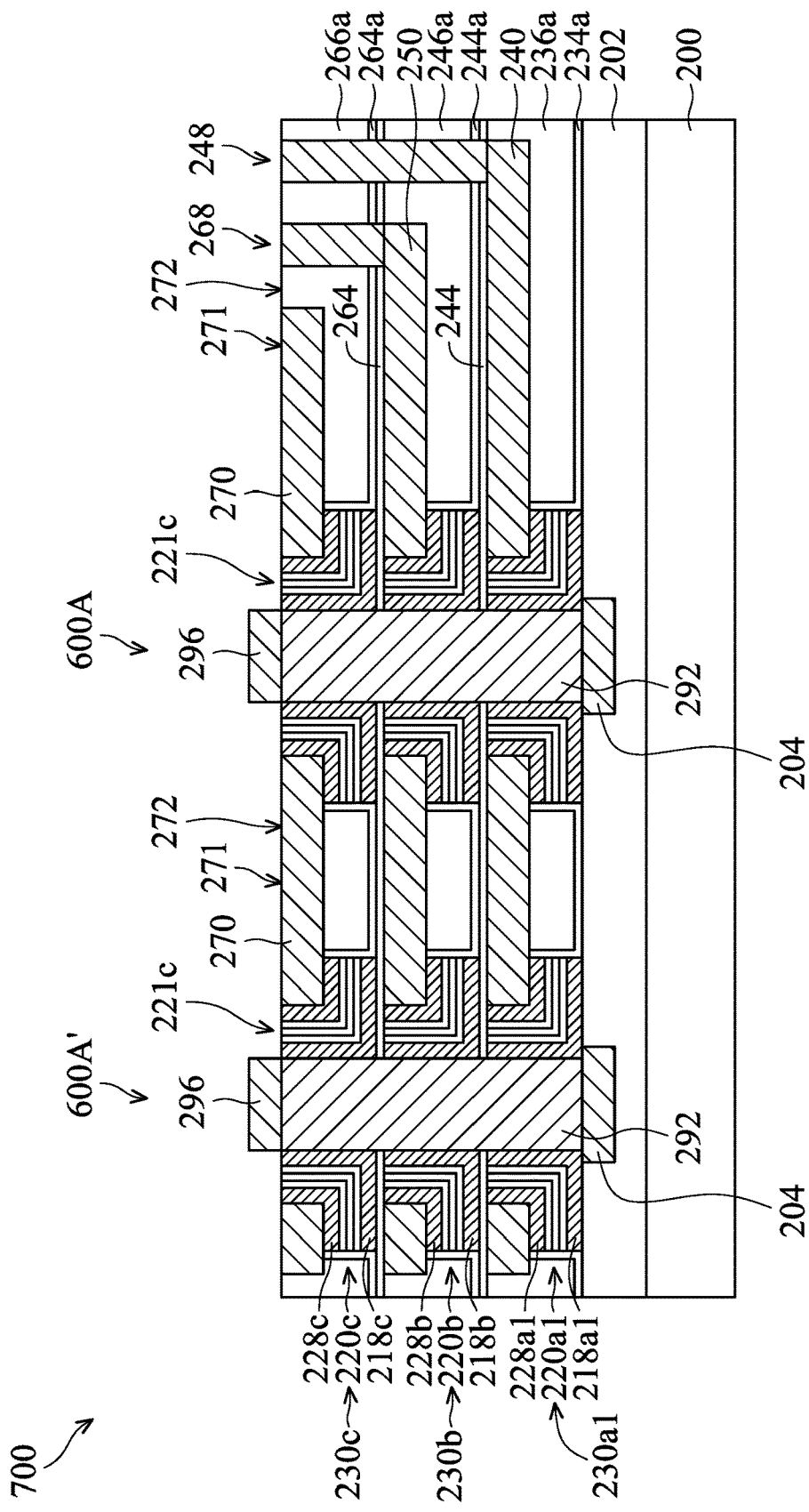
FIG. 3A is a cross-sectional view of an MRAM structure in accordance with some embodiments.
Figure 3B:
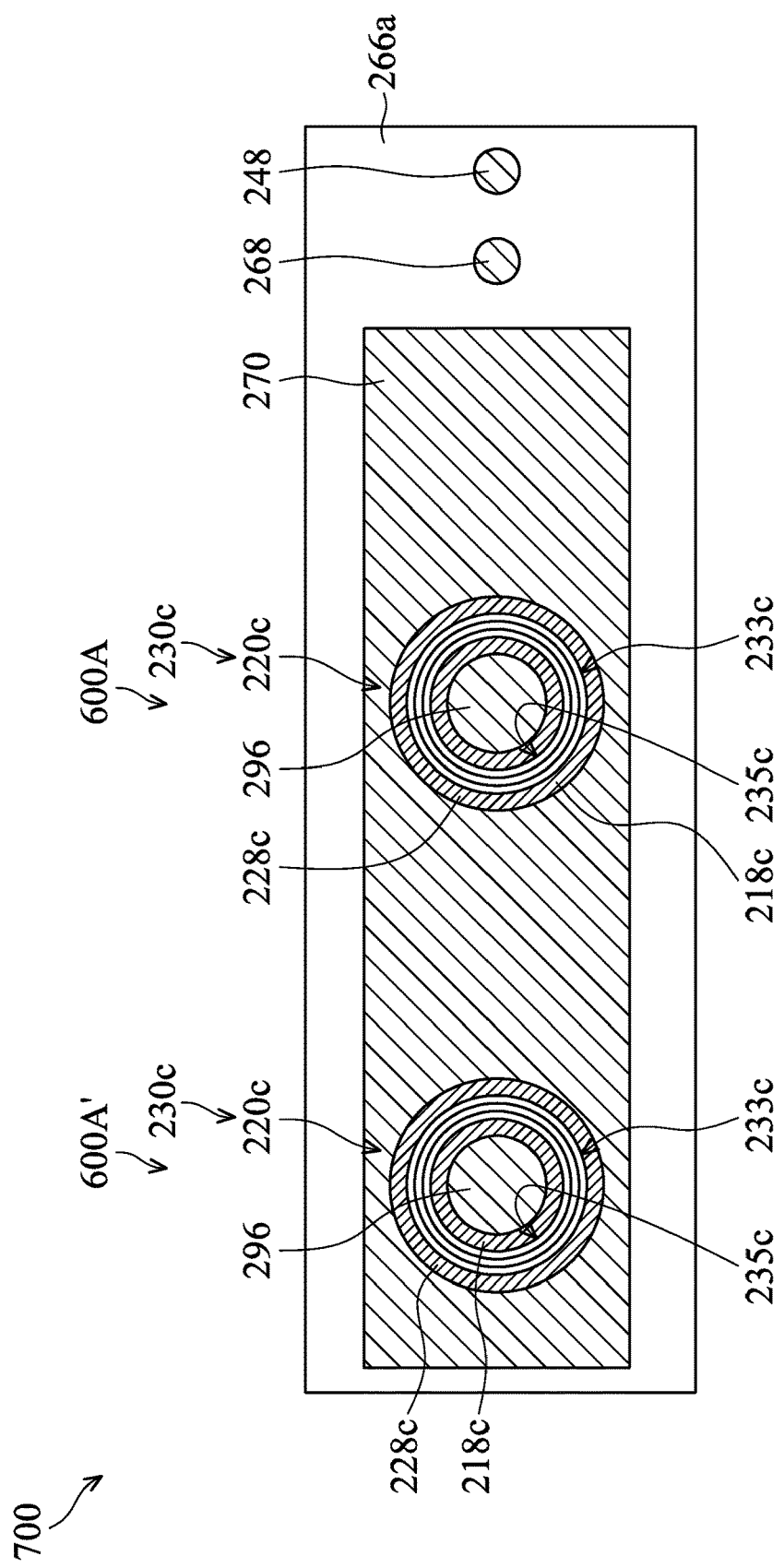
FIG. 3B is a plane view of an MRAM structure as shown in FIG. 3A, in accordance with some embodiments.

FIG. 3A is a cross-sectional view of an MRAM structure 700 in accordance with some embodiments. FIG. 3B is a plane view of FIG. 3A showing a plane view of an MRAM structure 700 in accordance with some embodiments. The materials, configurations, structures and/or processes utilized in elements of the MRAM structure 700 that are similar to those employed in the MRAM structure 600A shown in FIGS. 1A to 1N are not repeated herein.

In some embodiments, the MRAM structure 700 includes the MRAM structure 600A and an MRAM structure 600A', which is similar to or the same as the MRAM structure 600A and formed by the aforementioned processes shown in FIG. 1A to FIG. 1M, arranged side by side. In some embodiments, the number of MRAM structures 600A' arranged in the MRAM structure 700 depends on the number of stored bits in the MRAM structure 700. In addition, the number of the MTJ spacers of each of the MRAM structures 600A and 600A' depends on the number of stored bits in the MRAM structure 700. In some embodiments, the conductive feature 296 and the conductive pillar 292 of each of the MRAM structure 600A (or 600A') is in electrically connected to the first electrode layer 218a1 of the MTJ spacer 230a1, the first electrode layer 218b of the MTJ spacer 230b and the first electrode layer 218c of the MTJ spacer 230c of each of the MRAM structure 600A (or 600A'). The conductive layer 240 is electrically connected to the second electrode layer 228a1 of the MTJ spacer 230a1 of the MRAM structure 600A and the second electrode layer 228a1 of the MTJ spacer 230a1 of the MRAM structure 600A'. The conductive layer 250 is electrically connected to the second electrode layer 228b of the MTJ spacer 230b of the MRAM structure 600A and the second electrode layer 228b of the MTJ spacer 230b of the MRAM structure 600A'. In addition, the conductive layer 270 is electrically connected to the second electrode layer 228c of the MTJ spacer 230c of the MRAM structure 600A and the second electrode layer 228c of the MTJ spacer 230c of the MRAM structure 600A'.

Embodiments of a magnetoresistive random access memory (MRAM) structure (e.g. the MRAM structured 600A, 600A', 600B and 700) and a method for forming the same are provided. The MRAM structure includes a conductive pillar 292 over a substrate 200, a first magnetic tunneling junction (MTJ) spacer (e.g. the MTJ spacers 230a1, 230b, 330a and 330b) and a first conductive layer (e.g. the conductive layers 240 and 250). The first magnetic tunneling junction (MTJ) spacer surrounds the conductive pillar. The first conductive layer surrounds the first magnetic tunnel junction (MTJ) spacer. The first magnetic tunnel junction (MTJ) spacer includes a first electrode (e.g. the first electrodes 218a1 and 218b), a second electrode (e.g. the second electrodes 228a1 and 228b) and a magnetic tunnel junction (MTJ) layer (e.g. the magnetic tunnel junction (MTJ) layers 220a1 and 220b). The first electrode is in contact with the conductive pillar and the substrate. The second electrode is positioned over the first electrode and in contact with the first conductive layer. The magnetic tunnel junction (MTJ) layer is positioned between the first electrode and the second electrode. The MRAM structure includes tube-shaped MTJ spacers (e.g. the MTJ spacers 230a1, 230b, 230c, 330a, 330b and 330c) laminating vertically and formed in dielectric layers (e.g. the dielectric layers 236a, 246a and 266a) in different levels. The bottom electrodes (e.g. the first electrodes 218a1, 218b and 218c) of the MTJ spacers are formed surrounding and electrically connected to a single conductive pillar, which is arranged on the substrate 200 and is formed passing through the dielectric layers in different levels. In addition, the top electrodes (e.g. the second electrodes 228a1, 228b and 228c) of the MTJ spacers are electrically connected to conductive layers (e.g. the conductive layers 240, 250 and 270) arranged in the dielectric layers in different levels (e.g. the dielectric layers 236a, 246a and 266a). The number of stored data bits in the MRAM structure can be increased by laminating the tube-shaped MTJ spacers. Therefore, the MRAM structure has high integration density while the width of the MTJ spacers of the MRAM structure is kept.

Embodiments of a magnetoresistive random access memory (MRAM) structure and a method for forming the same are provided. The MRAM structure includes a conductive pillar over a substrate, a first MTJ spacer and a first conductive layer. The first MTJ spacer surrounds the conductive pillar. The first conductive layer surrounds the first MTJ spacer. The first magnetic tunnel junction (MTJ) spacer includes a first electrode, a second electrode and a magnetic tunnel junction (MTJ) layer. The first electrode is in contact with the conductive pillar and the substrate. The second electrode is positioned over the first electrode and in contact with the first conductive layer. The magnetic tunnel junction (MTJ) layer is positioned between the first electrode and the second electrode. The MRAM structure includes tube-shaped MTJ spacers laminating vertically and formed in dielectric layers in different levels. The bottom electrodes of the MTJ spacers are formed surrounding and electrically connected to a single conductive pillar, which is arranged on the substrate and is formed passing through the dielectric layers in different levels. In addition, the top electrodes of the MTJ spacers are electrically connected to conductive layers arranged in the dielectric layers in different levels. The number of stored data bits in the MRAM structure can be increased by laminating the tube-shaped MTJ spacers.

In some embodiments, a magnetoresistive random access memory (MRAM) structure is provided. The MRAM structure includes a conductive pillar over a substrate, a first MTJ spacer and a first conductive layer. The first MTJ spacer surrounds the conductive pillar. The first conductive layer surrounds the first MTJ spacer. The first magnetic tunnel junction (MTJ) spacer includes a first electrode, a second electrode and a magnetic tunnel junction (MTJ) layer. The first electrode is in contact with the conductive pillar and the substrate. The second electrode is positioned over the first electrode and in contact with the first conductive layer. The magnetic tunnel junction (MTJ) layer is positioned between the first electrode and the second electrode.

In some embodiments, a magnetoresistive random access memory (MRAM) structure is provided. The MRAM structure includes a first magnetic tunneling junction (MTJ) tube structure, a conductive pillar and a first conductive layer. The first magnetic tunneling junction (MTJ) tube structure is positioned over a substrate. The first magnetic tunneling junction (MTJ) tube structure includes a first electrode tube, a magnetic tunnel junction (MTJ) tube and a second electrode tube. The magnetic tunnel junction (MTJ) tube surrounds the first electrode tube. The second electrode tube surrounds the first magnetic tunneling junction (MTJ) tube. The conductive pillar is positioned in the first electrode tube. The first conductive layer surrounds the second electrode tube.

In some embodiments, a method for forming a magnetoresistive random access memory (MRAM) structure is provided. The method includes forming a first insulating pillar over a substrate. The method also includes forming a first magnetic tunneling junction (MTJ) spacer over a sidewall of the first insulating pillar. The method further includes forming a first conductive layer over a sidewall of the first magnetic tunneling junction (MTJ) spacer. The method further includes removing the first insulating pillar to form an opening surrounded by the first magnetic tunneling junction (MTJ) spacer. The method further includes forming a conductive pillar in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetoresistive random access memory (MRAM) structure, comprising:
    a conductive pillar over a substrate;
    a first magnetic tunneling junction (MTJ) spacer surrounding the conductive pillar, wherein the first magnetic tunnel junction (MTJ) spacer comprises:
        a first electrode in contact with the conductive pillar and the substrate;
        a second electrode over the first electrode; and
        a magnetic tunnel junction (MTJ) layer between the first electrode and the second electrode;
    a first conductive layer surrounding the first magnetic tunnel junction (MTJ) spacer, wherein the second electrode of the first magnetic tunnel junction (MTJ) spacer is in contact with the first conductive layer;
    a second magnetic tunneling junction (MTJ) spacer surrounding the conductive pillar, wherein the second magnetic tunnel junction (MTJ) spacer is positioned over the first magnetic tunnel junction (MTJ) spacer; and
    a second conductive layer surrounding the second magnetic tunnel junction (MTJ) spacer.

2. The MRAM structure as claimed in claim 1, further comprising:
    a first dielectric layer over the substrate, wherein the first dielectric layer surrounds the first magnetic tunnel junction (MTJ) spacer and the first conductive layer.

3. The MRAM structure as claimed in claim 2, wherein a top surface of the first magnetic tunnel junction (MTJ) spacer, a top surface of the first conductive layer and a top surface of the first dielectric layer are coplanar.

4. The MRAM structure as claimed in claim 1, wherein the second electrode surrounds the magnetic tunnel junction (MTJ) layer, and the magnetic tunnel junction (MTJ) layer surrounds the first electrode.

5. The MRAM structure as claimed in claim 1, wherein the magnetic tunnel junction (MTJ) layer comprises a fixed layer, a free layer and a tunnel layer between the fixed layer and the free layer, the fixed layer has a fixed magnetic polarity, and the free layer has a changeable magnetic polarity.

6. The MRAM structure as claimed in claim 1, wherein the first magnetic tunnel junction (MTJ) spacer is L-shaped or I-shaped in a cross-sectional view.

7. The MRAM structure as claimed in claim 1, further comprising:
    a second dielectric layer over the first conductive layer, wherein the second dielectric layer surrounds the second magnetic tunnel junction (MTJ) spacer and the second conductive layer.

8. The MRAM structure as claimed in claim 1, wherein the second magnetic tunnel junction (MTJ) spacer is positioned directly above the first magnetic tunnel junction (MTJ) spacer and separated from the first magnetic tunnel junction (MTJ) spacer by an etching stop layer.

9. A magnetoresistive random access memory (MRAM) structure, comprising:
a first magnetic tunneling junction (MTJ) tube structure over a substrate, wherein the first magnetic tunneling junction (MTJ) tube structure comprises:
a first electrode tube;
a magnetic tunnel junction (MTJ) tube surrounding the first electrode tube; and
a second electrode tube surrounding the magnetic tunneling junction (MTJ) tube;
a conductive pillar in the first electrode tube;
a first conductive layer surrounding the second electrode tube; and
a second magnetic tunneling junction (MTJ) tube structure overlaying the first MTJ tube structure, wherein the conductive pillar is surrounded by the second MTJ tube structure.

10. The MRAM structure as claimed in claim 9, wherein the MTJ tube has an inner sidewall in contact with the first electrode tube and an outer sidewall in contact with the second electrode tube.

11. The MRAM structure as claimed in claim 9, further comprising:
a first dielectric layer over the substrate, wherein the first dielectric layer surrounds the first MTJ tube structure, the conductive pillar and the first conductive layer.

12. The MRAM structure as claimed in claim 11, wherein a top surface of the first MTJ tube structure, a top surface of the conductive pillar, a top surface of the first conductive layer and a top surface of the first dielectric layer are coplanar.

13. The MRAM structure as claimed in claim 11, further comprising:
a second conductive layer surrounding the second MTJ tube structure; and
a second dielectric layer surrounding the second MTJ tube structure and the second conductive layer.

14. The MRAM structure as claimed in claim 9, wherein the first magnetic tunneling junction (MTJ) tube structure comprises a portion extending outward from the conductive pillar.

15. The MRAM structure as claimed in claim 9, further comprising:
an etching stop layer between the first magnetic tunnel junction (MTJ) tube structure and the second magnetic tunnel junction (MTJ) tube structure.

16. A magnetoresistive random access memory (MRAM) structure, comprising:
a conductive pillar over a substrate;
a first magnetic tunneling junction (MTJ) spacer surrounding the conductive pillar, wherein the first magnetic tunnel junction (MTJ) spacer comprises:
a first electrode;
a magnetic tunnel junction (MTJ) layer over the first electrode, wherein the first electrode and the magnetic tunnel junction (MTJ) layer are L-shaped; and
a second electrode over the magnetic tunnel junction (MTJ) layer;
a first dielectric layer surrounding a lower portion of the first magnetic tunnel junction (MTJ) spacer;
a first conductive layer formed in the first dielectric layer and surrounding an upper portion of the first magnetic tunnel junction (MTJ) spacer; and
a second magnetic tunnel junction (MTJ) spacer over the first magnetic tunneling junction (MTJ) spacer and surrounding the conductive pillar, wherein an interface between the first magnetic tunnel junction (MTJ) spacer and the conductive pillar is coplanar with an interface between the second magnetic tunnel junction (MTJ) spacer and the conductive pillar.

17. The MRAM structure as claimed in claim 16, wherein the second electrode is L-shaped, and a portion of the first magnetic tunneling junction (MTJ) spacer is covered by the first conductive layer.

18. The MRAM structure as claimed in claim 16, further comprising:
a second dielectric layer surrounding a lower portion of the second magnetic tunnel junction (MTJ) spacer; and
a second conductive layer formed in the second dielectric layer and surrounding an upper portion of the second magnetic tunnel junction (MTJ) spacer.

19. The MRAM structure as claimed in claim 18, further comprising:
a first etching stop layer between the first magnetic tunnel junction (MTJ) spacer and the second magnetic tunnel junction (MTJ) spacer; and
a second etching stop layer over the first etching stop layer, wherein the first etching stop layer and the second etching stop layer extend between the first conductive layer and the second dielectric layer, and the second magnetic tunnel junction (MTJ) spacer and the second dielectric layer and separated by the second etching stop layer.

20. The MRAM structure as claimed in claim 15, wherein a sidewall of the etching stop layer is in direct contact with a sidewall of the conductive pillar.

* * * * *